United States Patent [19]
Jaspers

[11] 3,991,345
[45] Nov. 9, 1976

[54] CIRCUIT ARRANGEMENT FOR SUPPLYING A SAWTOOTH DEFLECTION CURRENT

[75] Inventor: Cornelis Antonie Maria Jaspers, Eindhoven, Netherlands

[73] Assignee: U.S. Philips Corporation, New York, N.Y.

[22] Filed: July 24, 1974

[21] Appl. No.: 491,385

[30] Foreign Application Priority Data
Aug. 6, 1973 Netherlands.................... 7310811

[52] U.S. Cl. ............................. 315/388; 315/389
[51] Int. Cl.² ...................................... H01J 29/72
[58] Field of Search.................... 315/387, 388, 389

[56] References Cited
UNITED STATES PATENTS

| | | | |
|---|---|---|---|
| 3,735,192 | 5/1973 | Avery | 315/388 |
| 3,842,311 | 10/1974 | Knox | 315/388 |

Primary Examiner—Richard A. Farley
Attorney, Agent, or Firm—Frank R. Trifari; Henry I. Steckler

[57] ABSTRACT

A television field deflection circuit with a rapidly controllable large linearity. The deflection current is integrated in a first integrator which is followed by a second integrator having an adjustable time constant. The signals integrated once and twice are applied to a difference amplifier, while the signal integrated once is inverted and is adjustable through a feedback circuit. Subsequently a signal combination is formed of a non-integrated signal, a signal integrated once in phase, an adjustable signal integrated once in opposite phase and an adjustable signal integrated twice. The signal combination is fed back to a difference amplifier through which the deflection coil is fed and to which furthermore a sawtooth-shaped signal with a parabolic component is applied.

10 Claims, 1 Drawing Figure

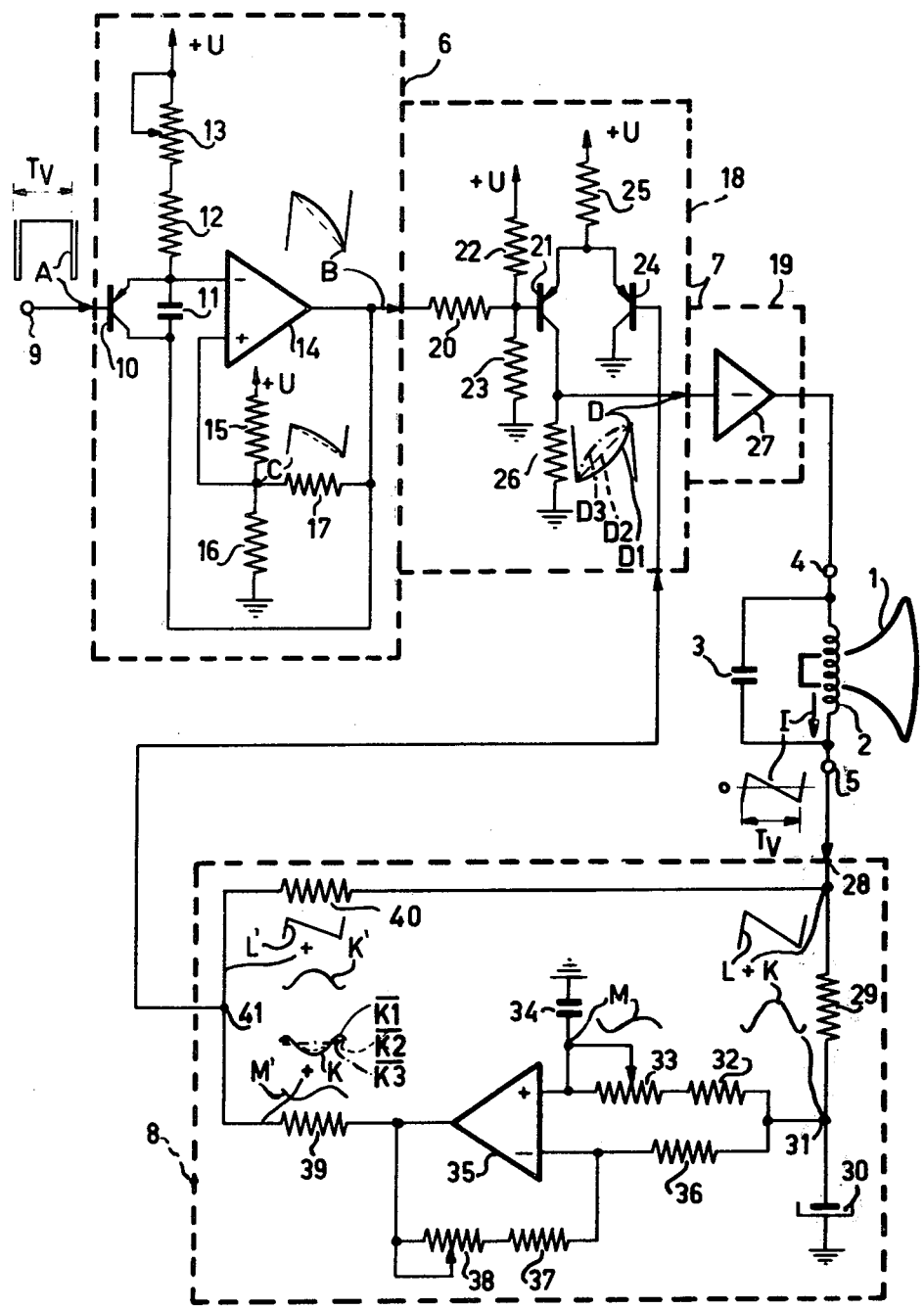

CIRCUIT ARRANGEMENT FOR SUPPLYING A SAWTOOTH DEFLECTION CURRENT

The invention relates to a circuit arrangement for supplying a sawtooth deflection current in a deflection coil for the field deflection in a television tube, which circuit arrangement is provided with a sawtooth generator for generating a substantially sawtooth-shaped signal, a signal amplifier connected thereto for the supply of the deflection coil and a signal feedback circuit for obtaining a linear field deflection for which purpose the signal feedback circuit incorporates a signal integrator formed with an input for the supply of information relating to the deflection current in the deflection coil and an output for signal feedback to a signal combining circuit which is furthermore formed with an input for non-feedback signal supply.

Such a circuit arrangement is described in U.S. Pat. No. 3,488,554. This patent states that the feedback circuit has two positive feedback paths ensuring the sawtooth generation through an own signal integrator and a signal combining circuit in the sawtooth generator and improving the linear variation of the deflection current. Furthermore an extra correction circuit is present for improving the linearity.

The described linearity improvement is obtained at the expense of a further complication of the deflection circuit. It is doubted whether the obtainable linearity improvement is sufficient for professional television display apparatus such as monitors for studios or for television circuits for example, X-ray television circuits in which increased line numbers are used for the fields for obtaining an increased picture definition upon display. The requirements for the linearity of the field deflection are very stringent in this case. The same applies to display apparatus for a video telephone in which the requirement is that the linearity errors must be less than, for example, 1%.

An object of the invention is to realize a circuit arrangement with which very stringent requirements for the linearity of the field deflection can be satisfied while the circuit arrangement has a simple structure. To this end the circuit arrangement according to the invention is characterized in that in the signal feedback circuit the output of the said signal integrator is connected through a second signal integrator to a first input of a second signal combining circuit and is directly connected to a second input thereof. The output of the second signal combining circuit and the input of the said first signal integrator are each connected to an input of a third signal combining circuit. The output of the third combining circuit thus conveys a signal combination of a non-integrated signal, a signal integrated once in phase with said non-integrated signal, a signal integrated once in opposite phase and, a signal integrated twice. This output is connected to an input of the said first signal combining circuit a second input of which is connected to the sawtooth generator.

A further embodiment of a circuit arrangement according to the invention is characterized in that the time constant of the second signal integrator and the transmission factor between the said second input and the output of the second signal combining circuit are each adjustable.

In practice a linearity deviation of less than 0.3% was measured when using a control circuit according to the invention. This result is achieved through a simple quick control of the independent controls of a parabolic correction obtained by the single signal integration on the one hand and an S-shaped correction obtained by the double signal integration on the other hand.

The invention will be described in greater detail by way of example with reference to the circuit arrangement shown in the accompanying FIGURE.

In the FIGURE the reference numeral 1 denotes a television tube in which a deflection coil 2 and a parallel capacitor 3 are shown. The tube 1 may be a display or a pick-up tube. The capacitor 3 is active as a high frequency bypass capacitor. The deflection coil 2 may consist of a plurality of coil parts which are provided in parallel or in series. The coil 2 provides for the field deflection of an electron beam (not shown) in the television tube 1 at a field frequency of 50 or 60 Hz. A deflection current I is shown at the coil 2 with a linear sawtooth-shaped variation over a field period $T_V$. The deflection current I is obtained by impressing a substantially sawtooth voltage on the connections 4 and 5 of the coil 2 because the coil 2 mainly behaves as a resistor at the low field frequency. For generating a deflection current I with a linear variation of the sawtooth during field deflection the voltage to be impressed on the connections 4 and 5 must not have a purely linear variation but also include higher order components. To this end the connections 4 and 5 in the FIGURE are connected to a series arrangement of a sawtooth generator 6 and a signal amplifier 7 and a feedback circuit 8 which is fed back to the signal amplifier 7.

The sawtooth generator 6 is provided with an input 9 to which a signal A shown is applied. The signal A has negative going pulses occurring periodically at the commencement of each field period $T_V$. These pulses may be denoted as field control pulses occurring in the so-called field blanking period while the field deflection at the tube 1 is effected during the remaining time of the field period $T_V$. In the sawtooth generator 6 the input 9 is connected to the base of a pnp transistor 10. A capacitor 11 is provided between the emitter and the collector of the transistor 10. Furthermore the emitter is connected through a series arrangement of a resistor 12 and a variable resistor 13 to a terminal conveying a voltage +U. The voltage +U is supplied by a voltage source U not shown which is furthermore provided with a terminal connected to ground. The junction of capacitor 11, resistor 12 and the emitter of transistor 10 is connected to a signal-inverting input (−) of a difference amplifier 14 while the junction of capacitor 11 and the collector of transistor 10 is connected to the amplifier output. The non-inverting input (+) of the difference amplifier 14 is connected to a junction of two resistors 15 and 16 operative as a potential divider provided between the terminal +U and ground. The junction in the potential divider 15, 16 is connected through a resistor 17 to the amplifier output. The supply voltage required for the amplifier 14 is not shown for the sake of simplicity.

A signal B is shown at the output of the amplifier 14. In the absence of the resistor 17 the signal B has a sawtooth shape shown by a broken line during the field deflection period. For the purpose of explanation a capacitor 11 discharged through the transistor 10 under the control of the field control pulses in the signal A is the starting point. A voltage equal to the bias at the + input then occurs at the amplifier output. After cutting off the transistor 10 a small constant charge current flows to the capacitor 11 through the resistors 12 and 13. The resultant very small linearly increasing voltage across the capacitor 11 occurs in an inverted form and amplified to a great extent at the amplifier output. The subsequent discharge of the capacitor 11 through the transistor 10 periodically active as an on-off switch results in the steep edge in the signal B going to the bias at the + input. Since, as will be apparent, it is desirable to have no purely linear variation in the field deflection period in the signal B, but a parabolic variation, the resistor 17 is provided. Instead of the constant bias at the + input as might be obtained when using the potential divider 15, 16 only, the voltage shown in a signal C occurs at the + input. A voltage decrease occurs in the signal C from the bias determined by the potential divider 15, 16 so that a voltage decrease which is initially less steep than the linear decrease occurs in the signal B. The generated signal B shown in solid lines has a linear voltage decrease with a parabolic decrease superimposed thereon. The amplitude of the signal B is determined by the adjustment of the variable resistor 13 with a lower resistive value resulting in a larger signal amplitude.

The sawtooth generator 6 applies the signal B to the signal amplifier 7 which is formed with a difference amplifier 18 and a final stage 19. In the amplifier 18 the signal B is applied through a resistor 20 to the base of a pnp transistor 21 which base is furthermore connected through resistors 22 and 23 to the terminal conveying the voltage +U and to ground, respectively. The emitter of the transistor 21 is connected to the emitter of a pnp-transistor 24 and they are jointly connected through a resistor 25 to the terminal conveying the voltage +U. The collector of the transistor 24 is directly connected to ground while that of the transistor 21 is connected to ground through a resistor 26. The base of transistor 24 forms one input of the difference amplifier 18 which is connected to the feedback circuit 8. Starting from the fact that the feedback circuit 8 supplies a sawtooth-shaped signal with a linear negative variation while the signal B is active at the base of the transistor 21, it follows that a signal D is present at the collector of the transistor 21 as is shown in solid lines in the FIGURE (signal D1).

The signal D is applied to the final stage 19 in which a signal inverting amplifier 27 is present. The detailed embodiment of the amplifier 27 is irrelevant. Since the amplifier 27 is connected to the connection 4 of the deflection coil 2, it is only important that a sufficient power is supplied in case of a satisfactory impedance matching so as to obtain the current I in the coil 2.

In the feedback circuit 8 an input 28 connected to connection 5 is connected to a resistor 29 whose other end is connected to a terminal of an electrolytic capacitor 30 the other terminal of which is connected to ground. The resistor 29 and the capacitor 30 constitute a signal integrator. Under the influence of current I with the linear sawtooth-shaped variation, a parabolic voltage as shown in a signal K occurs at the junction 31 of resistor 29 and capacitor 30. The signal K is superimposed on a constant direct voltage present across the capacitor 30 which direct voltage is half that of a supply voltage (not shown) of the amplifier 27 in the final stage 19. The current I furthermore produces a uniform voltage drop across the resistor 29 which is shown in a signal L. Thus a composite signal L+K occurs at the input 28 of the feedback circuit 8 which is at the same time the input of the signal integrator. The junction 31 conveying only the signal constitutes the output of the signal integrator which will be denoted by 28–31.

The output 31 of the signal integrator 28–31 is connected to a series arrangement of a resistor 32, a variable resistor 33 and a capacitor 34 to ground. This constitutes a second signal integrator 32, 33, 34 which conveys a voltage shown in the signal M in the FIGURE at the junction of the capacitor 34 and the resistor 33. Starting from the parabolic voltage in the signal K a voltage varying in accordance with an S function occurs due to the second integration in the signal M. It is to be noted for completeness' sake that the S-shaped variation in the signal M is not a pure third power function of the linear variation of the current I while the variation of the signal K has a pure second power function. In fact, the signal K is directly constituted by the integration of the linear current I while the current for the capacitor 34 does not vary in accordance with a pure parabola, which only applies to the voltage across capacitor 30.

The junction of capacitor 34 and the variable resistor 33 is connected to the + input of a difference amplifier 35. The − input of the amplifier 35 is connected through a resistor 36 to the output 31 of the first signal integrator 28–31. Furthermore the − input is connected through a resistor 37 and a variable resistor 38 to the amplifier output. The output of the amplifier 35 is connected through a series arrangement of two resistors 39 and 40 to the input 28 while the junction of the resistors 39 and 40 constitutes the output 41 of the feedback circuit 8 connected to the difference amplifier 18.

The resistors 39 and 40 constitute a signal combining circuit 39, 40, 41 in the feedback circuit 8. There applies that the values of the resistors 39 and 40 must be much larger than the value of the resistor 29. Likewise the difference amplifier 35 and the resistors 36, 37 and 38 constitute a further signal combining circuit 35–38 in the feedback circuit 8. The difference amplifier 18 is active as a signal combining circuit in the signal amplifier 7 for combining the signal B from the sawtooth generator 6 and a signal to be described hereinafter which originates from the feedback circuit 8. For a further embodiment of a signal combining circuit a composition of two transistors with a common collector load and signal supplied to the bases is mentioned.

Starting from equal resistances of the resistors 39 and 40 there follows that the composite signal L + K occurring at the input 28 occurs half at the output 41 through the resistor 40 which is denoted by a composite signal L' + K' in the FIGURE. In case of unequal resistances another voltage division is effected. The contribution denoted by a composite signal M' + K' supplied by the amplifier 35 occurs through the resistor 39. The contribution of the signal M' is determined by the adjustment of the variable resistor 33 in the signal integrator 32, 33, 34. Instead of adjusting the time constant of the signal integrator 32, 33, 34 with the aid of resistor 33 this might also be effected with the aid of a variable capacitor 34. The contribution of the signal $\overline{K}$ is determined by the adjustment of the variable resistor 38. For the signal K the transmission factor in the signal combining circuit 35–38 is equal to the ratio of the sum of the values of the resistors 37 and 38 and of the value of the resistor 36. The signal inversion by supply to the − input of the amplifier 35 is denoted by the striped notation ($\overline{K}$) while $\overline{K}_1$, $\overline{K}_2$ and $\overline{K}_3$ show some possible signals. Instead of a signal inversion for the signal K performed between the output 31 and the resistor 39 it might as well be effected in the connection between the input 28 and the resistor 40.

It is found that the output 41 conveys a signal combination of the non-integrated signal L', the signal K' integrated once and being in phase therewith, the adjustable signal $\overline{K}$ integrated once and being in phase opposition to the signal K, and the adjustable signal M' integrated twice. No K signal component occurs at the output 41 when the signals K' and $\overline{K}$ have the same amplitudes occurring in phase opposition as applies for the signal K1. The combination of the signal L' and the adjustable signal M' is present at the base of the transistor 24 in the amplifier 18. It is assumed that the signal M' is reduced to a negligible contribution. The supply of the signal L' alone to the base of the transistor 24 causes the signal D to occur as the signal D1 shown when the signal B is applied to the base of the transistor 21. When subsequently the value of the resistor 38 is reduced until the signal $\overline{K}$ occurs as the signal K2, part of the parabolic signal K' occurs at the base of the transistor 24. The result is that the signal D occurs as the signal D2 shown. A further reduction of the amplitude of the signal $\overline{K}$ to a negligible value (signal $\overline{K}3$) causes the signal D to occur as the signal D3 shown. Instead of the resistor 38 resistor 36 might be adjustable. The solution given in the FIGURE is most favourable due to the low impedance at the output of the amplifier 35. Independent of the adjustment at the signal $\overline{K}$ the signal M' can be added with its own adjustment through the resistor 33.

The signal B is generated by the sawtooth generator 6 as a sawtooth-shaped signal having a parabolic component superimposed on a linear variation. The reason thereof is that the adjustable signals D1, D2 and D3 can be obtained in the signal D by only attenuating the signal K and this in accordance with the signals K1, K2 and $\overline{K}3$, starting from equal amplitudes in the signals K' and $\overline{K}$. For the stability of the circuit arrangement it is desirable that the amplitude of the signal $\overline{K}$ is not larger than that of the signal K'. When on the other hand the sawtooth shape varies linearly in the signal B, which results in the signal D2 with only the signal L' at the base of the transistor 24, the adjustment to the signal D1 could only be obtained by rendering the amplitude of the signal $\overline{K}$ larger than that of the signal K' which, as stated, is undesirable.

In practice the circuit arrangement shown in the FIGURE has many advantages.

The parabola correction and the S-correction which can be achieved simultaneously in a simple manner are independently adjustable, which leads to a quick control and results in linearity deviations of less than 0.3 %.

The circuit arrangement has a low number of components and apart from the capacitors 11, 30 and 34, it can be integrated in a semiconductor body.

By using the capacitor 30 the DC level in the generated deflection current is automatically adjusted correctly.

The stability of the circuit arrangement at temperature fluctuations in the range of −10° C to +60° C is within ± 0.3 %.

The following values are given by way of illustration.

| Voltage U | 10 V | Coil 2 | 16.5 mH, 7.5Ω |

| | | | |
|---|---|---|---|
| Capacitor 11 | 220 nF | capacitor 3 | 180 pF |
| Resistor 12 | 47 kΩ | Resistor 29 | 1Ω |
| Resistor 13 | 100 KΩ | Capacitor 30 | 3.3 mF |
| Resistor 15 | 2.2 kΩ | Resistor 32 | 47 kΩ |
| Resistor 16 | 3.2 kΩ | Resistor 33 | 220 kΩ |
| Resistor 17 | 2.7 kΩ | Capacitor 34 | 470 nF |
| Resistor 20 | .18 kΩ | Resistor 36 | 22 kΩ |
| Resistor 22 | 2.2 kΩ | Resistor 37 | 10 kΩ |
| Resistor 23 | 6.8 kΩ | Resistor 38 | 22 kΩ |
| Resistor 25 | 3.3 kΩ | Resistors 39 and 40 | 15 kΩ |

What is claimed is:

1. A circuit arrangement for supplying a sawtooth-shaped deflection current in a deflection coil for field deflection in a television tube, which circuit arrangement comprises a sawtooth generator means for generating a substantially sawtooth-shaped signal, a signal amplifier means coupled to said generator for the supply of the deflection coil, a signal feedback circuit means for obtaining a linear field deflection including a first signal integrator having an input means for the supply of information relating to the deflection current in the deflection coil and an output means for signal feedback, said signal amplifying means comprising a first signal combining circuit coupled to said output means and having an input for non-feedback signal supply, the improvement comprising a second signal integrator coupled to said first integrator output, a second signal combining circuit having a first input coupled to the second integrator output and a second input coupled to said first integrator output, and a third signal combining circuit having inputs respectively coupled to the output of the second signal combining circuit and the input of said first signal integrator, the third signal combining circuit having an output means for conveying a signal combination of a non-integrated signal, a signal integrated once in phase, a signal integrated once in opposite phase and a signal integrated twice, and third combining circuit output, being coupled to an input of said first signal combining circuit, a second input of said first combining circuit being coupled to the sawtooth generator means.

2. A circuit arrangement as claimed in claim 1, further comprising means for adjusting the time constant of the second integrator and means for adjusting the transmission factor between said second input and the output of the second signal combining circuit.

3. A circuit arrangement as claimed in claim 1, wherein the second signal combining circuit comprises a difference amplifier the said second input of which is a signal-inverting input, a resistor coupled to said inverting input and to the output of said first signal integrator and a resistive feedback circuit coupled to said inverting input and to the output of the difference amplifier.

4. A circuit arrangement as claimed in claim 3, wherein the resistance of the resistive feedback circuit is adjustable to vary said transmission factor of the second signal combining circuit.

5. A circuit arrangement as claimed in claim 1, wherein the third signal combining circuit comprises a series arrangement of two resistors, one end of the series arrangement being coupled to the output of the second signal combining circuit and the other end being coupled to the input of said first signal integrator, said first integrator comprising a resistor coupled between the said input and output thereof, the values of the resistors in the series arrangement being large relative to the value of said resistor in said first signal integrator, the output of the third signal combining circuit comprising the junction of the resistors in the series arrangement.

6. A circuit arrangement as claimed in claim 1, wherein said first signal combining circuit comprises a difference amplifier and a final stage coupled to said difference amplifier and to an output for connection to the deflection coil, the input of said first signal integrator being connectable to another connection of the deflection coil.

7. A circuit arrangement as claimed in claim 1, wherein the sawtooth generator generates a linear sawtooth-shaped and superimposed parabolic signal and comprises a difference amplifier having an output, a non-inverting input, and a signal-inverting input, a resistor coupled to said inverting input and to a voltage source, a capacitor coupled to said resistor and to the amplifier output, a periodically active on-off switch coupled in parallel with the capacitor, a resistive potential divider coupled to said non-inverting input, said non-inverting input being coupled through a resistor to the amplifier output for generating the parabolic signal.

8. A circuit arrangement as claimed in claim 1 wherein the greater part of the circuit arrangement is integrated in a semiconductor body.

9. Television display apparatus provided with a circuit arrangement as claimed in claim 1.

10. A circuit for a deflection coil comprising means for generating a sawtooth signal; means coupled to said generating means for amplifying said sawtooth signal and for applying the amplified signal to said coil, said amplifying and applying means comprising a first combining circuit having a first input means coupled to said generating means and a second input means; and feedback means for obtaining linear deflection including a first integrator having an input means for receiving a signal from said coil and an output, a second signal integrator coupled to said first integrator output, a second combining circuit having a first input means coupled to said second integrator, a second input means coupled to said first integrator, and an output, a third combining circuit having a pair of input means respectively coupled to the second combining circuit output and the input means of said first integrator, said third combining circuit having an output means coupled to said first combining circuit second input means for providing the combination of a non-integrated signal, an in phase integrated signal, an out of phase integrated signal, and a twice integrated signal.

* * * * *